United States Patent
Godo

(10) Patent No.: US 8,824,177 B2
(45) Date of Patent: Sep. 2, 2014

(54) SEMICONDUCTOR DEVICE AND SNUBBER DEVICE HAVING A SIC-MOSFET AND A ZENER DIODE

(75) Inventor: Shinsuke Godo, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 129 days.

(21) Appl. No.: 13/016,275

(22) Filed: Jan. 28, 2011

(65) Prior Publication Data

US 2011/0310645 A1   Dec. 22, 2011

(30) Foreign Application Priority Data

Jun. 21, 2010   (JP) ................. 2010-140192

(51) Int. Cl.
*H02H 7/122* (2006.01)
*H03K 17/0814* (2006.01)
*H02M 1/34* (2007.01)
*H01L 23/495* (2006.01)
*H01L 23/00* (2006.01)
*H01L 29/866* (2006.01)
*H01L 49/02* (2006.01)
*H01L 27/06* (2006.01)
*H01L 29/16* (2006.01)
*H01L 29/06* (2006.01)
*H01L 29/78* (2006.01)

(52) U.S. Cl.
CPC .............. *H02M 1/34* (2013.01); *H01L 24/48* (2013.01); *H03K 17/08148* (2013.01); *H01L 29/866* (2013.01); *H01L 2224/48137* (2013.01); *H01L 28/20* (2013.01); *H01L 23/49575* (2013.01); *Y02B 70/1483* (2013.01); *H01L 27/0629* (2013.01); *H01L 2224/48247* (2013.01); *H01L 2924/13091* (2013.01); *H01L 29/1608* (2013.01); *H01L 29/0619* (2013.01); *H01L 29/7802* (2013.01); *H01L 2924/13055* (2013.01)
USPC ........................................ 363/56.12

(58) Field of Classification Search
USPC .......................... 363/56.12; 323/276; 361/118
See application file for complete search history.

(56) References Cited

U.S. PATENT DOCUMENTS 5,343,098 A * 8/1994 Miyasaka ..................... 327/310
7,511,357 B2 * 3/2009 Hshieh ......................... 257/551

FOREIGN PATENT DOCUMENTS

DE        3445340 A1 *  6/1986  .......... H03K 17/687
JP     2002-95238        3/2002
(Continued)

OTHER PUBLICATIONS

Japanese Office Action issued Nov. 6, 2012, in Japan Patent Application No. 2010-140192 (with English translation).

(Continued)

*Primary Examiner* — Adolf Berhane
*Assistant Examiner* — Yemane Mehari
(74) *Attorney, Agent, or Firm* — Oblon, Spivak, McClelland, Maier & Neustadt, L.L.P.

(57) ABSTRACT

A semiconductor device of the present invention includes a switching transistor, and a recovery diode and a snubber device which are mounted on a single conductive substrate (frame) on which the switching transistor is also mounted. The snubber device includes a SiC-MOSFET connected between an output terminal C and a reference terminal E of the switching transistor, a Zener diode formed between a gate terminal G and a drain terminal D of the SiC-MOSFET, and a resistor formed between the gate terminal G and a source terminal S of the SiC-MOSFET. The reference terminal E of the switching transistor, the source terminal S of the SiC-MOSFET, and an anode terminal of the recovery diode are commonly connected.

10 Claims, 8 Drawing Sheets

(56) References Cited

FOREIGN PATENT DOCUMENTS

| JP | 20020952380 A | * | 3/2002 |
| JP | 2006-333595 | | 12/2006 |
| JP | 2007-287992 | | 11/2007 |
| JP | 2007287992 A | * | 11/2007 |
| JP | 2010-115099 | | 5/2010 |

OTHER PUBLICATIONS

U.S. Appl. No. 13/396,934, filed Feb. 15, 2012, Godo, et al.
Decision of Rejection issued Jan. 22, 2013, in Japanese Patent Application No. 2010-140192 with partial English translation.

* cited by examiner

US 8,824,177 B2

SEMICONDUCTOR DEVICE AND SNUBBER DEVICE HAVING A SIC-MOSFET AND A ZENER DIODE

BACKGROUND OF THE INVENTION

1. Field of the Invention

The present invention relates to a snubber device which suppresses a surge voltage generated at a time of turn-off of a switching element or a reverse recovery of a diode used in an inverter or a chopper circuit, and also to a semiconductor device using the snubber device.

2. Description of the Background Art

In an inverter semiconductor module using a switching element having a high switching rate, such as an IGBT, a high voltage (turn-off surge voltage) is generated in floating inductance of a main circuit due to a rapid change of a current at a time of turn-off. At a time when a free-wheeling diode is turned off, a surge voltage (recovery surge voltage) is generated on the same principle.

Thereby, an external protection circuit (snubber device) which absorbs such a surge voltage is provided to a semiconductor module, to thereby suppress the surge voltage. In a typical basic configuration of the snubber device, a resistance R, a diode D, and a capacitor C are combined (for example, Japanese Patent Application Laid-Open No. 2010-115099), a resistance value and the capacitance of a capacitor are adjusted by wiring inductance of an application and the level of a drive current.

Although the external snubber device is an element necessary for a safe operation of a switching element, it is necessary to design heat dissipation of the snubber device itself, which increases the size as an application. Additionally, there is a problem of increased costs and efforts due to low-inductance wiring designing.

SUMMARY OF THE INVENTION

An object of the present invention is to provide a semiconductor device including a snubber device which suppress costs of heat dissipation designing and wiring designing.

A semiconductor device of the present invention includes a switching transistor, a recovery diode, and a snubber device. The recovery diode and the snubber device are mounted on a single conductive substrate on which the switching transistor is also mounted. The snubber device includes a SiC-MOSFET, a Zener diode, and a resistor. The SiC-MOSFET is connected between an output terminal and a reference terminal of the switching transistor. The Zener diode is connected between a gate terminal and a drain terminal of the SiC-MOSFET. The resistor is connected between the gate terminal and a source terminal of the SiC-MOSFET. The reference terminal of the switching transistor, the source terminal of the SiC-MOSFET, and an anode terminal of the recovery diode are commonly connected.

The semiconductor device of the present invention includes the recovery diode and the snubber device which are mounted on the single conductive substrate on which the switching transistor is also mounted. This allows unification of a cooling system for the snubber device with a cooling system for the switching transistor, to downsize a package. Additionally, it is attractive to some end users, because the snubber is not needed.

A snubber device of the present invention is a snubber device which absorbs a surge voltage of a switching transistor. The snubber device of the present invention includes a SiC-MOSFET, a Zener diode, and a resistor. The Zener diode is connected between a gate terminal and a drain terminal of the SiC-MOSFET. The resistor is connected between the gate terminal and a source terminal of the SiC-MOSFET.

When the snubber device of the present invention is connected in parallel with a circuit including a plurality of switching transistors, the number of snubber devices can be reduced as compared with a case where the snubber device is individually provided for each of the switching transistors. Thus, low costs are realized.

These and other objects, features, aspects and advantages of the present invention will become more apparent from the following detailed description of the present invention when taken in conjunction with the accompanying drawings.

DESCRIPTION OF THE PREFERRED EMBODIMENTS (Preferred Embodiment 1)

Figure 1:
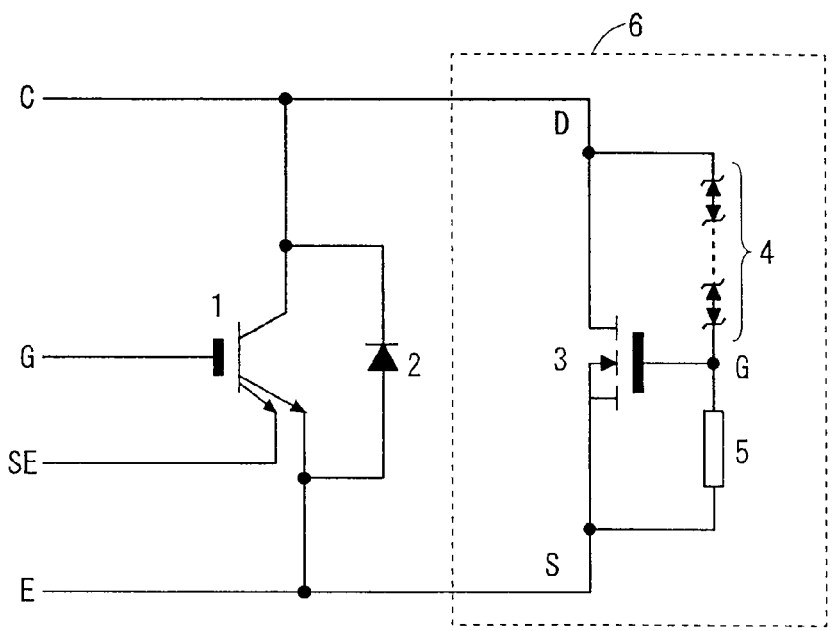
FIG. 1 is a circuit diagram of a switching module according to a preferred embodiment 1.

FIG. 1 shows a circuit diagram of a switching module which is an example of a semiconductor device according to this preferred embodiment. The switching module includes an IGBT 1 which is a main switching element, a recovery diode 2 connected between a collector C and an emitter E of the IGBT 1, and a snubber device 6 which absorbs a surge voltage. The snubber device 6 includes a SiC-MOSFET 3 connected between the collector C and the emitter E of the IGBT 1, a Zener diode 4 connected between a drain D and a gate G of the SiC-MOSFET 3, and a resistor 5 connected between the gate G and a source S of the SiC-MOSFET 3. As the SiC-MOSFET 3, for example, N-channel enhancement-mode one is used. Each of the Zener diode 4 and the resistor 5 is formed of polysilicon.

Figure 2:
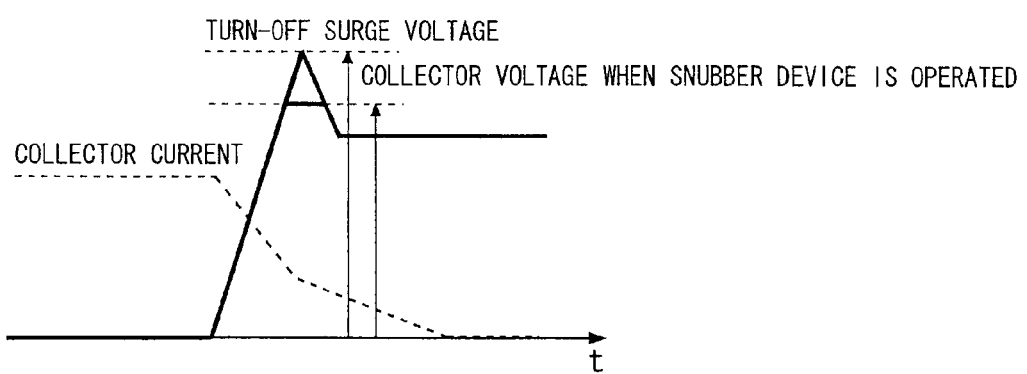
FIG. 2 is a diagram showing an operation of a snubber device.

A threshold voltage of the Zener diode 4 is normally set higher than a power supply voltage which is applied to the collector of the IGBT 1. When the surge voltage exceeds the threshold voltage of the Zener diode 4, a voltage drop occurs in the resistor 5, so that a gate voltage of the SiC-MOSFET 3 is raised to bring the SiC-MOSFET 3 into an ON state. Since large part of surge energy passes through the SiC-MOSFET 3 and is consumed (active clamp), the risk of application of an excessive surge voltage to the IGBT 1 and the recovery diode 2 is reduced (see FIG. 2).

Figure 3:
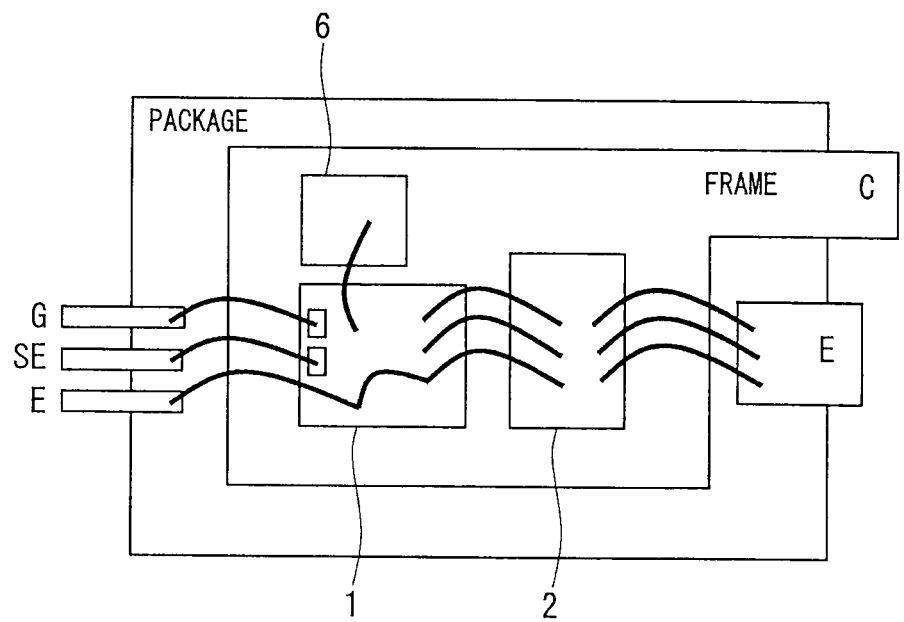
FIG. 3 is a diagram showing a configuration of the switching module according to the preferred embodiment 1.

FIG. 3 is diagram showing a configuration of the switching module. The IGBT 1, the recovery diode 2, and the snubber device 6 are mounted on a single lead frame, and a collector terminal C, an emitter terminal E, a gate terminal G, and a sense terminal SE of the IGBT 1 are exposed to the outside of a package.

Figure 4:
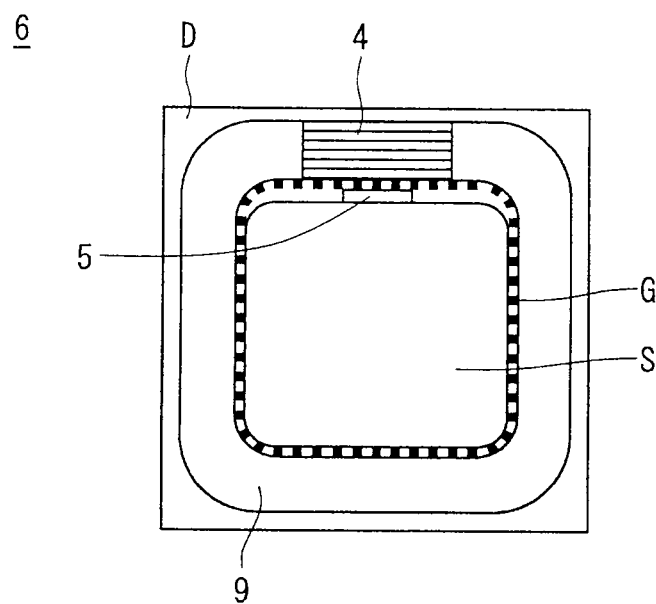
FIG. 4 is a diagram showing a chip configuration of a snubber device according to the preferred embodiment 1.

FIG. 4 is a plan view of a chip of the snubber device 6 as seen from the upper side. A drain electrode D of the SiC-MOSFET 3 is formed on a back surface of the chip. A source electrode S of the SiC-MOSFET 3 is formed on a surface of the chip. A gate electrode G of the SiC-MOSFET 3 is formed around the source electrode S. Additionally, a guard ring layer 9 is formed around the gate electrode G. The Zener diode 4 is formed on the guard ring layer 9, and the resistor 5 is formed between the gate electrode G and the source electrode S of the SiC-MOSFET 3.

In the switching module of this preferred embodiment, the IGBT 1 which is a switching element and the snubber device 6 which absorbs the surge voltage are mounted on a single lead frame in this manner. This contributes to improvement of the system security and in addition to downsizing.

Conventionally, such a snubber device is provided as an external device to a package of a switching element. However, configuring a snubber device by using a power MOSFET allows the snubber device to be mounted on the single lead frame on which the switching element is also mounted. Moreover, by using SiC which is a wide-bandgap material for the power MOSFET, heat generation due to a snubber loss can be suppressed, to allow unification of a cooling system for the snubber device 6 with a cooling system for the switching element. Consequently, the system as a whole can be downsized.

If the snubber device 6 is disposed immediately near a switching element needing a protection within the single lead frame, parasitic inductance can be minimized to obtain the maximum protection performance.

<Effects>

The semiconductor device according to the preferred embodiment 1 provides the following effects. The semiconductor device of this preferred embodiment includes the switching transistor 1, the recovery diode 2 and the snubber device 6 which are mounted on a single lead frame on which the switching transistor 1 is mounted. The snubber device 6 includes the SiC-MOSFET 3 connected between an output terminal (collector terminal C) and a reference terminal (emitter terminal E) of the switching transistor (IGBT 1), the Zener diode 4 formed between the gate terminal G and the drain terminal D of the SiC-MOSFET 3, and the resistor 5 formed between the gate terminal G and the source terminal S of the SiC-MOSFET 3. The emitter terminal E of the switching transistor 1, the source terminal of the SiC-MOSFET 3, and an anode terminal of the recovery diode are commonly connected. This allows unification of a heat dissipation system for the snubber device 6 with a heat dissipation system for the switching transistor 1, thus enabling downsizing of the system as a whole. By disposing the snubber device 6 immediately near the switching transistor 1 on the single lead frame, the parasitic inductance can be minimized to obtain the maximum protection performance.

The Zener diode 4 and the resistor 5 are formed on the single chip on which the SiC-MOSFET 3 is also formed. The above-mentioned effects are obtained by this configuration.

(Preferred Embodiment 2)

In the preferred embodiment 1, the Zener diode 4 and the resistor 5 which are necessary for the active clamp are formed on the single chip (snubber device 6) on which the SiC-MOSFET 3 is also formed. While the SiC-MOSFET 3 which absorbs the surge energy is a SiC device operable at a high temperature, the Zener diode 4 and the resistor 5 are formed of polysilicon and therefore their performance is reduced in a high-temperature operation, which causes a bottleneck.

In a preferred embodiment 2, therefore, the SiC-MOSFET 3 which generates heat in an active clamping operation is formed as an element separate from the Zener diode 4 and the resistor 5 which have no energy load, so that the protection performance against larger surge energy can be exhibited.

Figure 5:
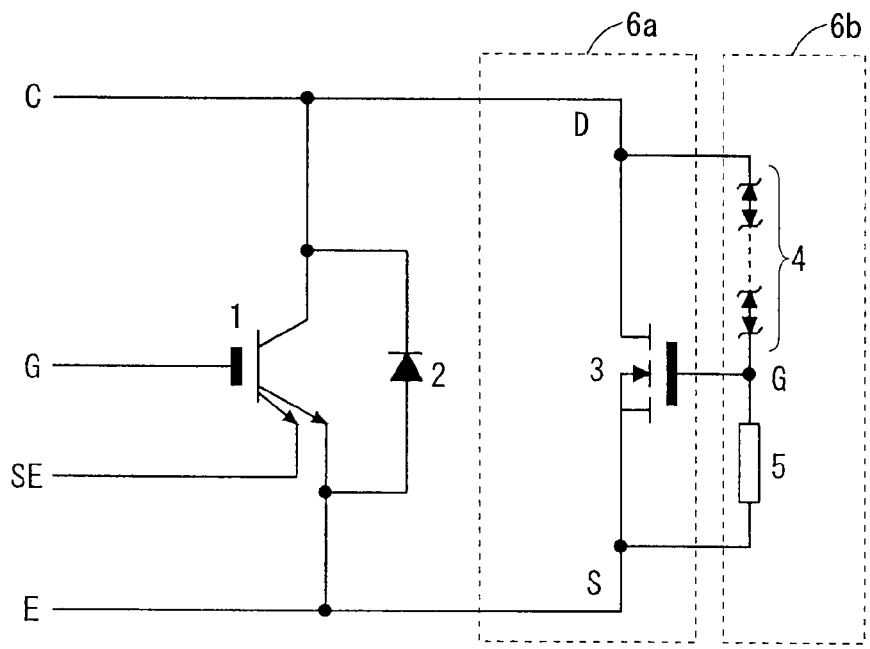
FIG. 5 is a circuit diagram of a switching module according to a preferred embodiment 2.

FIG. 5 shows a circuit diagram of a switching module which is an example of a semiconductor device according to the preferred embodiment 2. The same component parts as those of the preferred embodiment 1 are denoted by the same corresponding reference numerals. The circuit diagram shown in FIG. 5 is the same as the circuit diagram of the preferred embodiment 1 shown in FIG. 1, except that a chip on which the Zener diode 4 and the resistor 5 are provided is different from a chip on which the SiC-MOSFET 3 is provided.

Figure 6:
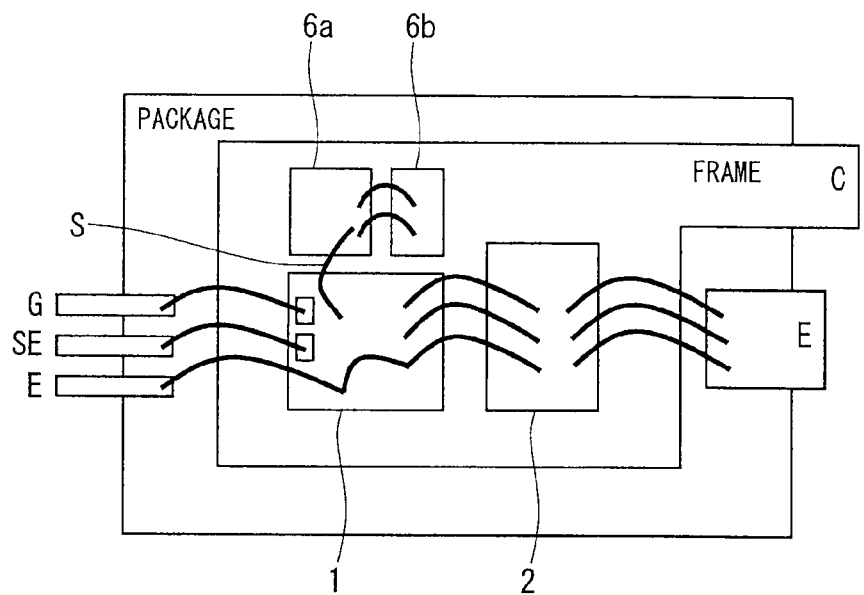
FIG. 6 is a diagram showing a configuration of the switching module according to the preferred embodiment 2.

FIG. 6 is a diagram showing a configuration of the switching module. The IGBT 1, the recovery diode 2, a first snubber device 6a including the SiC-MOSFET 3, a second snubber device 6b including the Zener diode 4 and the resistor 5 are mounted on a single lead frame. The collector terminal C, the emitter terminal E, the gate terminal G, and the sense terminal SE of the IGBT 1 are exposed to the outside of a package.

Figure 7:
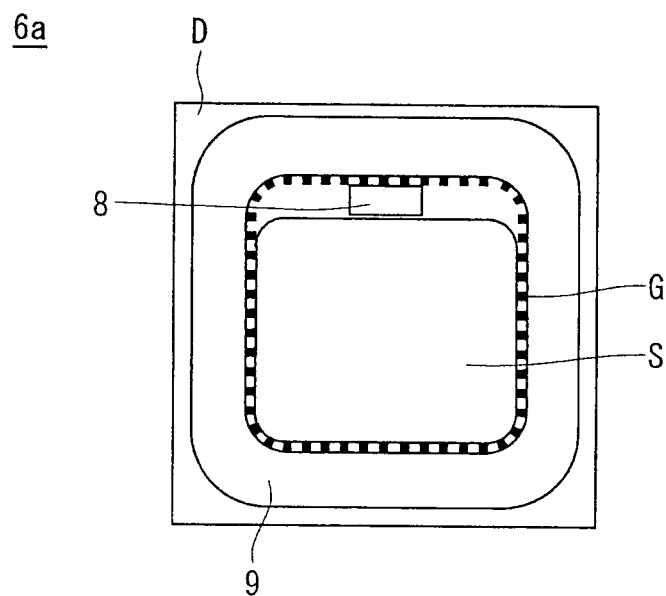
FIG. 7 is a diagram showing a chip configuration of a snubber device according to the preferred embodiment 2.

FIG. 7 is a plan view of a chip of the first snubber device 6a as seen from the upper side. The drain electrode D of the SiC-MOSFET 3 is formed on a back surface of the chip. The source electrode S of the SiC-MOSFET 3 is formed on a surface of the chip. The gate electrode G of the SiC-MOSFET 3 is formed around the source electrode S. A gate pad 8 is formed adjacent to the gate electrode G, and the guard ring layer 9 is formed around the gate electrode G.

Figure 8:
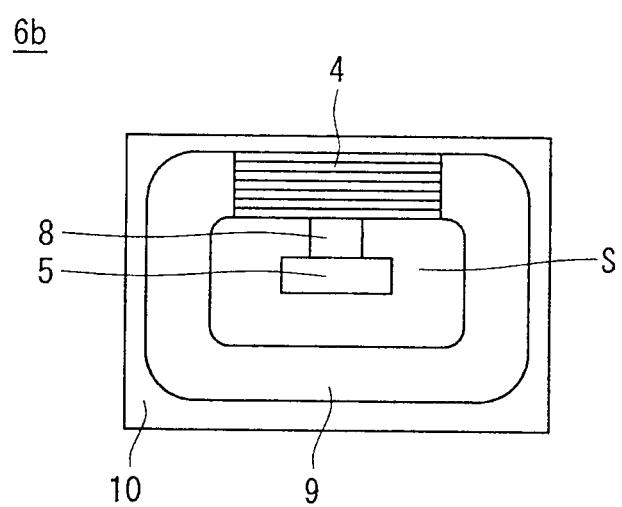
FIG. 8 is a diagram showing a chip configuration of the snubber device according to the preferred embodiment 2.

FIG. 8 is a plan view of a chip of the second snubber device 6b as seen from the upper side. The source terminal S serving as a common terminal which is conducted to the source terminal S of the SiC-MOSFET 3 is formed on a surface of the chip. A gate pad 8 is formed on the source terminal S. The resistor 5 is formed adjacent to the gate pad 8. The guard ring 9 is formed around the source terminal S, and the Zener diode 4 is formed on the guard ring 9. An outer periphery of the guard ring 9 serves as a channel cut part 10.

<Effects>

The semiconductor device according to the preferred embodiment 3 provides the following effects. In the semiconductor device of this preferred embodiment, the Zener diode 4 and the resistor 5 made of polysilicon are formed on the chip separate from the chip on which the SiC-MOSFET 3 is provided. Thereby, the bottleneck in the high-temperature operation is eliminated so that the protection performance can be exhibited against larger surge energy.

(Preferred Embodiment 3)

In the configuration of the preferred embodiment 2, the special semiconductor device (second snubber device 6b) is required for arranging the Zener diode 4 and the resistor 5 necessary for the active clamping operation. In a preferred embodiment 3, a silicon device is used as the IGBT 1, and the Zener diode 4 and the resistor 5 are formed on a single device (switching device 7) on which the IGBT 1 is also formed. Thereby, the number of chips and the number of wirings are decreased and cost reduction is realized.

Figure 9:
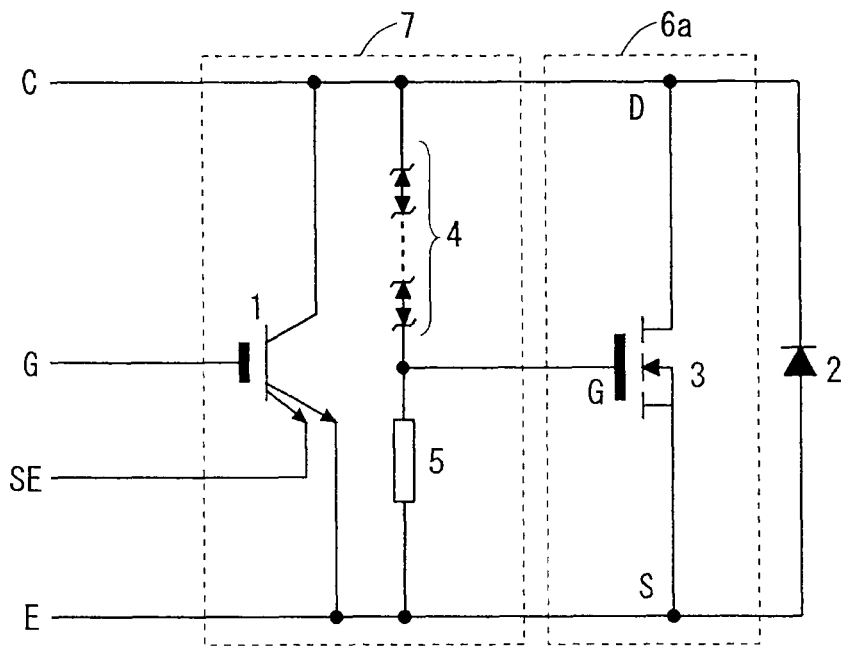
FIG. 9 is a circuit diagram of a switching module according to a preferred embodiment 3.
Figure 10:
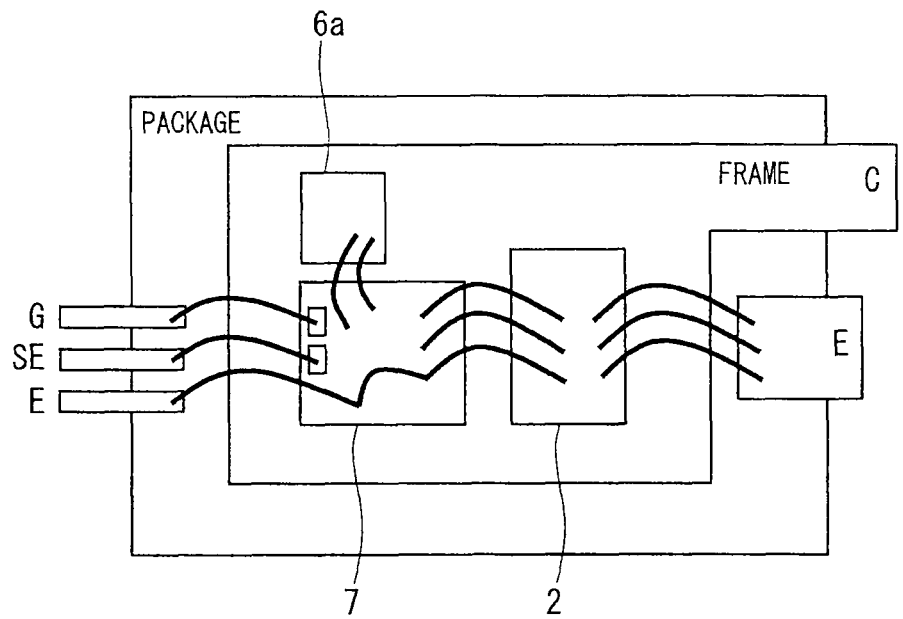
FIG. 10 is a diagram showing a configuration of the switching module according to the preferred embodiment 3.

FIG. 9 shows a circuit diagram of a switching module which is an example of a semiconductor device according to the preferred embodiment 3. FIG. 10 is a diagram showing a configuration of the switching module. In FIGS. 9 and 10, the same component parts as those of the preferred embodiment 2 are denoted by the same corresponding reference signs.

In the switching module, as shown in FIG. 10, the switching device 7, the recovery diode 2, and the snubber device 6a including the SiC-MOSFET 3 are mounted on a single lead frame. The collector terminal C, the emitter terminal E, the gate terminal G, and the sense terminal SE of the IGBT 1 are exposed to the outside of a package. The switching device 7 is a Si device, on which the IGBT 1, the Zener diode 4, and the resistor 5 are formed.

<Effects>

The semiconductor device according to the preferred embodiment 3 provides the following effects. In the semiconductor device of this preferred embodiment, the IGBT 1 is configured as a Si substrate, and the Zener diode 4 and the resistor 5 are formed on the single device (switching device) on which the IGBT 1 is also formed. Thereby, the bottleneck in the high-temperature operation is eliminated, and moreover the number of chips and the number of wirings are reduced to allow cost reduction.

(Preferred Embodiment 4)

Figure 11:
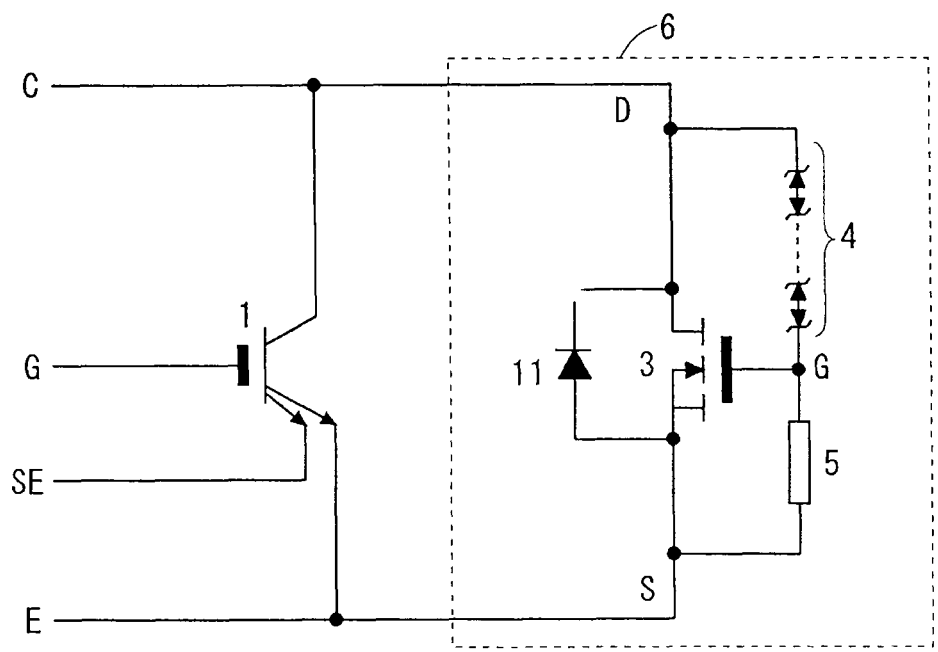
FIG. 11 is a circuit diagram of a switching module according to a preferred embodiment 4.
Figure 12:
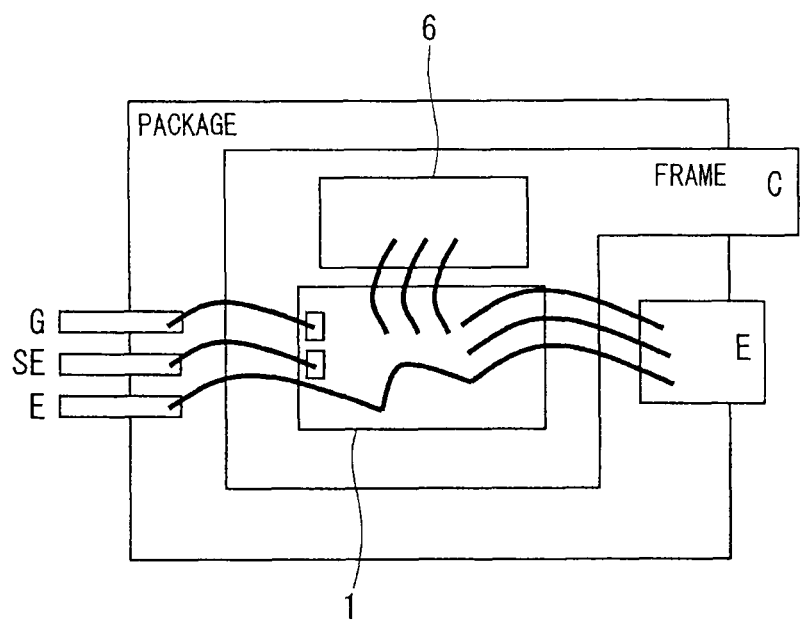
FIG. 12 is a diagram showing a configuration of the switching module according to the preferred embodiment 4.

FIG. 11 shows a circuit diagram of a switching module which is an example of a semiconductor device according to a preferred embodiment 4, and FIG. 12 is a diagram showing a configuration of the switching module. In FIGS. 11 and 12, the same component parts as those of the preferred embodiment 1 are denoted by the same corresponding reference signs. The switching module of this preferred embodiment is different from that of the preferred embodiment 1 in that a body diode 11 of the SiC-MOSFET 3 is used as a recovery diode of the IGBT 1.

As shown in FIG. 12, in the switching module, the IGBT 1 and the snubber device 6 are mounted on a single lead frame, and the collector terminal 1, the emitter terminal E, the gate terminal G, and the sense terminal SE of the IGBT 1 are exposed to the outside of a package.

<Effects>

In the semiconductor device of the preferred embodiment 4, the body diode of the SiC-MOSFET 3 is used as the recovery diode of the IGBT 1, and thereby the recovery diode can be omitted so that the cost reduction can be realized.

(Preferred Embodiment 5)

Figure 13:
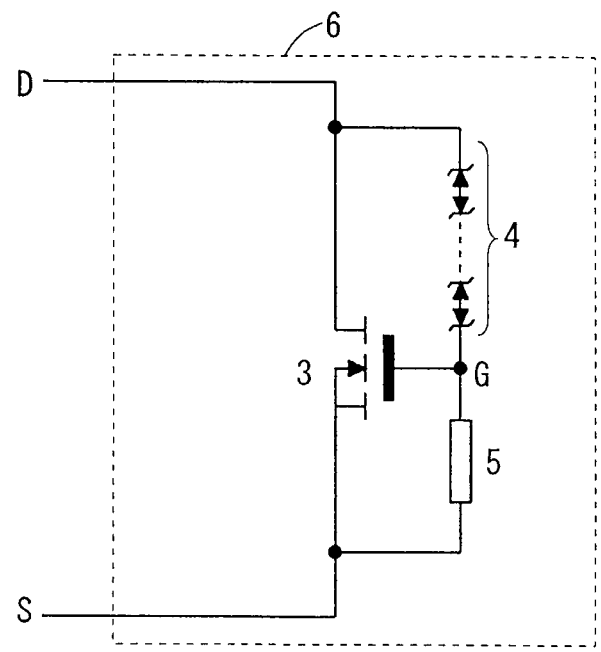
FIG. 13 is a circuit diagram of a snubber device according to a preferred embodiment 5.
Figure 14:
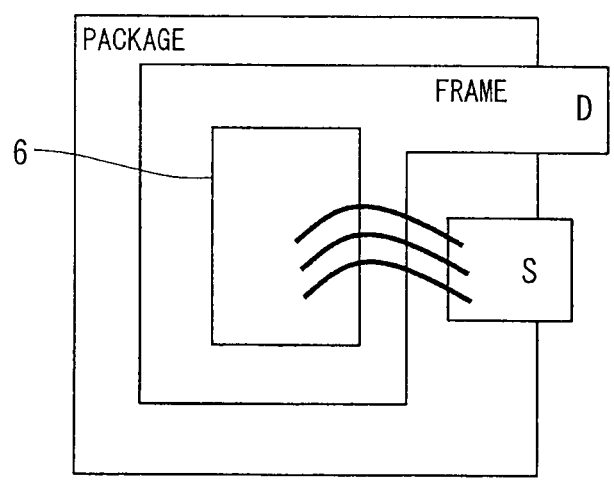
FIG. 14 is a diagram showing a configuration of the snubber device according to the preferred embodiment 5.

FIG. 13 shows a circuit diagram of a snubber device of this preferred embodiment, and FIG. 14 is a diagram showing a configuration of the snubber device of this preferred embodiment. A circuit configuration of the snubber device is the same as that of the snubber device of the switching module of the preferred embodiment 1, except that only the snubber device 6 is formed as a single package as shown in FIG. 14. The same component parts as those of the preferred embodiment 1 are denoted by the same corresponding reference numerals. The snubber device 6 is mounted on a lead frame, and the drain terminal D and the source terminal S of the SiC-MOSFET 3 are exposed to the outside of the package.

Figure 15:
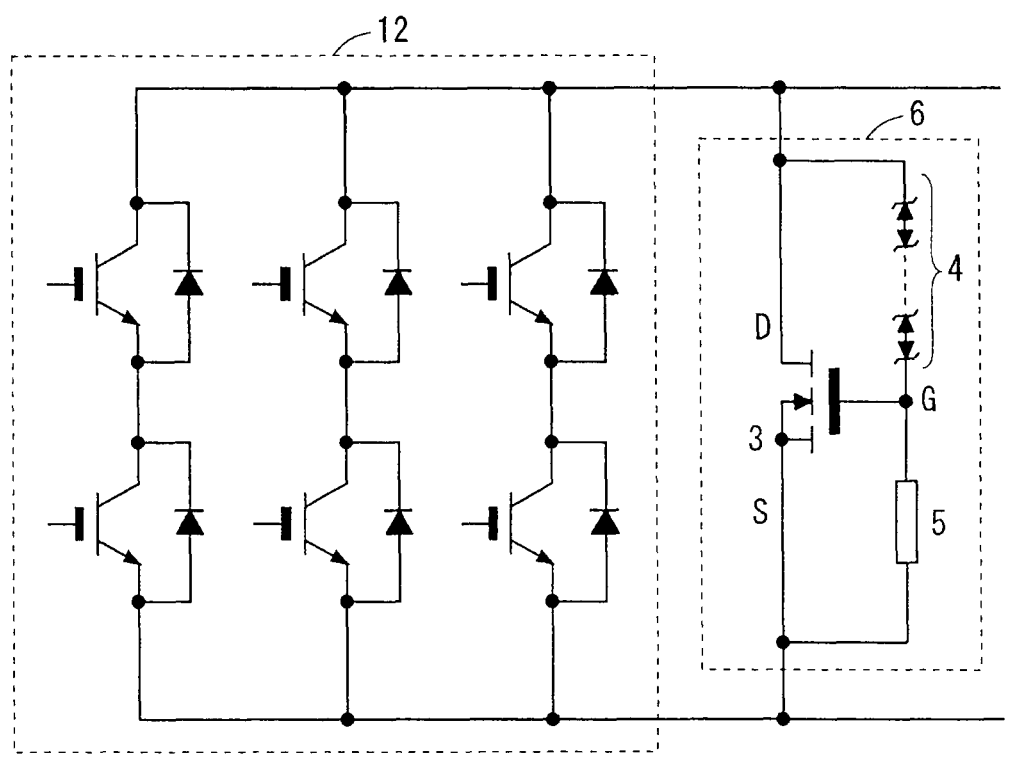
FIG. 15 is a circuit diagram of a switching module according to the preferred embodiment 5.

As shown in FIG. 15, this snubber device is used as a lump snubber which is connected in parallel with an inverter module 12 including a plurality of switching elements. Adoption of this configuration allows reduction in the number of snubber devices as compared with a case where a snubber device is individually provided for each of the switching elements, and thus allows the cost reduction.

In the configuration of the snubber device, the Zener diode 4 and the resistor 5 are configured on a device on which the SiC-MOSFET 3 is also formed. Here, it may also be possible that the Zener diode 4 and the resistor 5 are configured as separate devices as in the preferred embodiment 2. In this case, the bottleneck in the high-temperature operation can eliminated, and the protection performance against larger surge energy can be exhibited.

<Effects>

The snubber device according to this preferred embodiment provides the following effects. The snubber device 6 of the preferred embodiment 5 is a snubber device which absorbs surge voltage of the switching transistor, and includes the SiC-MOSFET 3, the Zener diode 4 formed between the gate terminal G and the drain terminal D of the SiC-MOSFET 3, and the resistor 5 formed between the gate terminal G and the source terminal S of the SiC-MOSFET 3. By connecting this snubber device 6 collectively to the inverter module including the plurality of switching elements, the number of snubber devices can be reduced to realize the cost reduction.

The snubber device 6 absorbs the surge voltage of the inverter module 12 including the plurality of switching transistors. By connecting the snubber device 6 in parallel with the inverter module 12, the number of snubber devices can be reduced to realize the cost reduction.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device comprising:
   a switching transistor; and
   a recovery diode and a snubber device mounted on a single conductive substrate on which said switching transistor is also mounted,
   wherein
   said snubber device includes:
      a SiC-MOSFET connected between an output terminal and a reference terminal of said switching transistor;
      a Zener diode connected between a gate terminal and a drain terminal of said SiC-MOSFET; and
      a resistor connected between said gate terminal and a source terminal of said SiC-MOSFET,
      the reference terminal of said switching transistor, the source terminal of said SiC-MOSFET, and an anode terminal of said recovery diode are commonly connected, and
   wherein current is permitted to pass in both directions between the Zener diode and the gate terminal of said SiC-MOSFET.

2. The semiconductor device according to claim 1, wherein said Zener diode and said resistor are formed on a single chip on which said SiC-MOSFET is also formed.

3. The semiconductor device according to claim 1 wherein said Zener diode and said resistor are made of polysilicon, and formed on a chip separate from a chip on which said SiC-MOSFET is formed.

4. The semiconductor device according to claim 1, wherein said switching transistor is formed of a Si substrate, said Zener diode and said resistor are formed on said switching transistor.

5. The semiconductor device according to claim 1, wherein said recovery diode is a body diode of said SiC-MOSFET.

6. The semiconductor device according to claim 1, wherein said switching transistor is an insulated-gate bipolar transistor.

7. The semiconductor device according to claim 1, wherein the recovery diode and the snubber device are independently mounted on the single conductive substrate on which the switching transistor is also mounted.

8. The semiconductor device according to claim 1, wherein the snubber device further includes a plurality of Zener diodes connected between a gate terminal and a drain terminal of said SiC-MOSFET.

9. A semiconductor device comprising:
a switching transistor; and
a recovery diode and a snubber device mounted on a single conductive substrate on which said switching transistor is also mounted,
wherein
said snubber device includes:
   a SiC-MOSFET connected between an output terminal and a reference terminal of said switching transistor;
   a Zener diode connected between a gate terminal and a drain terminal of said SiC-MOSFET; and
   a resistor connected between said gate terminal and a source terminal of said SiC-MOSFET,
   the reference terminal of said switching transistor, the source terminal of said SiC-MOSFET, and an anode terminal of said recovery diode are commonly connected, and
wherein current is permitted to pass in both directions entirely between the Zener diode and the gate terminal of said SiC-MOSFET.

10. A semiconductor device comprising:
a switching transistor;
a recovery diode; and
a snubber device including:
   a SiC-MOSFET connected between an output terminal and a reference terminal of said switching transistor;
   a Zener diode connected between a gate terminal and a drain terminal of said SiC-MOSFET; and
   a resistor connected between said gate terminal and a source terminal of said SiC-MOSFET,
   the reference terminal of said switching transistor, the source terminal of said SiC-MOSFET, and an anode terminal of said recovery diode are commonly connected, and
wherein current is permitted to pass in both directions between the Zener diode and the gate terminal of said SiC-MOSFET.

* * * * *